United States Patent
Kang et al.

(10) Patent No.: US 10,600,341 B2
(45) Date of Patent: Mar. 24, 2020

(54) CURVED DISPLAY DEVICE AND ELECTRONIC DEVICE USING THE SAME

(71) Applicant: LG Display Co., Ltd., Seoul (KR)

(72) Inventors: Choun-Sung Kang, Goyang-si (KR); Se-Eun Kim, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/169,848

(22) Filed: Oct. 24, 2018

(65) Prior Publication Data
US 2019/0130796 A1    May 2, 2019

(30) Foreign Application Priority Data

Oct. 31, 2017   (KR) .................. 10-2017-0144016

(51) Int. Cl.
| | | |
|---|---|---|
| G09F 9/30 | (2006.01) | |
| H05K 7/20 | (2006.01) | |
| G02F 1/1333 | (2006.01) | |
| H01L 27/32 | (2006.01) | |
| H01L 51/00 | (2006.01) | |
| H01L 51/52 | (2006.01) | |

(52) U.S. Cl.
CPC ............ *G09F 9/301* (2013.01); *G02F 1/1333* (2013.01); *H01L 27/3244* (2013.01); *H01L 51/0097* (2013.01); *H01L 51/529* (2013.01); *H05K 7/20954* (2013.01); *H05K 7/20963* (2013.01); *H01L 2251/5338* (2013.01)

(58) Field of Classification Search
USPC ........................................................ 361/749
See application file for complete search history.

(56) References Cited

U.S. PATENT DOCUMENTS

| | | | |
|---|---|---|---|
| 5,831,374 A | * | 11/1998 | Morita ............... H05K 7/20963 313/46 |
| 10,194,538 B2 | | 1/2019 | Lee et al. |
| 2014/0002975 A1 | | 1/2014 | Lee et al. |
| 2015/0321442 A1 | | 11/2015 | Lee et al. |
| 2015/0340646 A1 | | 11/2015 | Shin et al. |
| 2016/0021764 A1 | | 1/2016 | Lee et al. |
| 2016/0363805 A1 | * | 12/2016 | Lee ................... G02F 1/133308 |

FOREIGN PATENT DOCUMENTS

| | | |
|---|---|---|
| EP | 0 821 385 A2 | 1/1998 |
| GB | 2541609 A | 2/2017 |
| JP | H03-057187 A | 3/1991 |

(Continued)

OTHER PUBLICATIONS

The Intellectual Property Office of the United Kingdom, Combined Search and Examination Report under Sections 17 and 18(3), GB Patent Application No. GB1817756.8, dated Apr. 15, 2019, five pages.

(Continued)

*Primary Examiner* — Andargie M Aychillhum
(74) *Attorney, Agent, or Firm* — Fenwick & West LLP

(57) ABSTRACT

A curved display device and an electronic device using the same, includes a display panel and a bottom cover formed to have a multi-layered clad metal coupling structure, and a heat dissipation layer and a pattern portion are defined in the bottom cover so as to assure improved heat dissipation performance and stiffness.

25 Claims, 8 Drawing Sheets

(56) References Cited

FOREIGN PATENT DOCUMENTS

| | | |
|---|---|---|
| JP | H09-199040 A | 7/1997 |
| JP | H11-095675 A | 4/1999 |
| JP | 2008-542834 A | 11/2008 |
| JP | 2016-059030 A | 4/2016 |
| JP | 2017-524975 A | 8/2017 |
| TW | 201725717 A | 7/2017 |
| WO | WO 2006/129232 | 12/2006 |
| WO | WO 2019/047383 A1 | 3/2019 |

OTHER PUBLICATIONS

Taiwan Intellectual Property Office, Office Action, TW Patent Application No. 107137035, dated Sep. 23, 2019, 11 pages.
Japan Patent Office, Notice of Reasons for Refusal, JP Patent Application No. 2018-203997, dated Nov. 26, 2019, four pages.

* cited by examiner

Inner Curve

Outer Curve

CURVED DISPLAY DEVICE AND ELECTRONIC DEVICE USING THE SAME

CROSS-REFERENCE TO RELATED APPLICATIONS

This application claims the benefit of Republic of Korea Patent Application No. 10-2017-0144016, filed on Oct. 31, 2017, which is hereby incorporated by reference in its entirety.

BACKGROUND

Field of Technology

The present disclosure relates to a display device, and more particularly to a curved display device that is capable of assuring improved heat dissipation performance and stiffness and to an electronic device using the same.

Discussion of the Related Art

An image display device, which realizes various pieces of information on a screen, is a core technology of the information and communication age, and is being developed in the direction of becoming thinner and lighter and having higher performance. As a flat panel display device that is capable of overcoming the problems of disadvantageous weight and volume of a cathode ray tube (CRT), for example, an organic light-emitting display device, which uses a self-illuminating organic light-emitting element and therefore does not require a separate light source, is attracting attention.

Such an organic light-emitting display device displays an image using a plurality of pixels, which are arranged in a matrix form. Here, each pixel includes a light-emitting element and a pixel-driving circuit having multiple transistors that implement independent driving of the light-emitting element.

Recently, in terms of various applications, there is increasing demand for flexible display devices, which can be conveniently carried in a pocket or purse and which can display an image on a larger screen than when being carried, and curved display devices for use in large-scale display devices, which are curved from the center to the edges thereof with a predetermined curvature so as to offer users enhanced immersiveness.

In order to provide flexible display devices or curved display devices with flexibility or curvature, the display devices must be made slim in construction. However, the slim construction of the display devices entails insufficient dissipation of heat generated from a drive circuit or a display module. Further, the reliability of the display devices is degraded due to low stiffness, which is required for the curved configuration of the display devices.

FIG. 1 is a view showing the occurrence of slip at the time of curved deformation of a curved display device of the related art.

As shown in FIG. 1, the curved display device of the related art includes a display panel 10 and a bottom cover 20 for supporting the display panel 10. The display panel 10 and the bottom cover 20 are the same size and are stacked one on another.

In the case of an inwardly curved configuration (also referred to as "inner curve"), in which the display panel 10 is deformed so as to be curved in the inward direction by physical force applied thereto, the display panel 10 is curved with a relatively small radius of curvature, and the bottom cover 20 is curved with a relatively large radius of curvature. At this time, due to this difference in radius of curvature between the display panel 10 and the bottom cover 20, there occurs a slip phenomenon in which both edges of the display panel 10 protrude further outwards than both edges of the bottom cover 20.

Similarly, in the case of an outwardly curved configuration (also referred to as "outer curve"), in which the display panel 10 is deformed so as to be curved in the outward direction by physical force applied thereto, the bottom cover 20 is curved with a relatively small radius of curvature, and the display panel 10 is curved with a relatively large radius of curvature. At this time, due to this difference in radius of curvature between the bottom cover 20 and the display panel 10, there occurs a slip phenomenon in which both edges of the bottom cover 20 protrude further outwards than both edges of the display panel 10.

This phenomenon that occurs at the time of curved deformation is irritating to the viewer. Therefore, efforts are being made to solve this problem.

SUMMARY

Accordingly, the present disclosure is directed to a curved display device and an electronic device using the same that substantially obviate one or more problems due to limitations and disadvantages of the related art.

An object of the present disclosure is to provide a curved display device that is capable of assuring improved heat dissipation performance and stiffness by modifying a bottom cover structure.

Another object of the present disclosure is to provide an electronic device using the above curved display device.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a curved display device includes a bottom cover having a multi-layered structure and is capable of assuring improved heat dissipation performance and stiffness by providing the multi-layered structure of the bottom cover with a predetermined pattern.

In an aspect of the present invention, a curved display device includes a bottom cover including a first layer and a second layer, and a display panel disposed on the second layer of the bottom cover, wherein the first layer is formed in a plate configuration, and includes a plurality of flat portions having the same thickness and arranged in a matrix form and a pattern portion including a plurality of slits formed between the flat portions, and the second layer is disposed on the first layer, and includes a plurality of heat-dissipating metal members that are arranged in a group on the same layer so as to come into contact only with the flat portions.

The curved display device may further include an adhesive pad provided along the edges of the display panel and the second layer while being disposed therebetween.

The curved display device may further include a printed circuit board connected to one side of the display panel, and the printed circuit board may be disposed between the display panel and the bottom cover.

The printed circuit board may be connected to the one side of the display panel via a flexible film.

The first layer may be formed of steel use stainless that has higher stiffness than the materials of the heat-dissipating metal members and the display panel.

The heat-dissipating metal members may be bonded to the flat portions by clad-bonding.

In another aspect of the present invention, an electronic device includes the curved display device according to the above-described embodiment, and a system cover for containing the display panel and the bottom cover such that the top surface of the display panel is exposed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
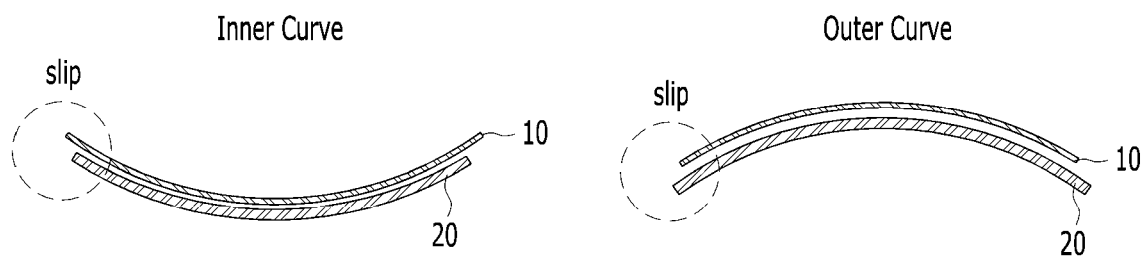
FIG. 1 is a view showing the occurrence of slip at the time of curved deformation of a curved display device of the related art.

Reference will now be made in detail to various embodiments of the present disclosure, examples of which are illustrated in the accompanying drawings. In the drawings, the same or similar elements are denoted by the same reference numerals even when they are depicted in different drawings. In the following description of the present disclosure, a detailed description of known functions and configurations incorporated herein will be omitted when it may obscure the subject matter of the present disclosure. Before explaining embodiments of the present invention, it is to be understood that the phraseology and terminology used in the following specification and appended claims should not be construed as being limited to general and dictionary meanings, but should be construed as having meanings and concepts according to the spirit of the present invention on the basis of the principle that the inventor is permitted to define appropriate terms for the best explanation.

It will be understood that when an element such as a layer, film, region or substrate is referred to as being "on" another element, it can be directly on the other element, or intervening elements may also be present. On the other hand, when an element such as a layer, film, region or substrate is referred to as being "directly on" another element, this means that there are no intervening elements therebetween.

In addition, in the drawings, for more clear explanation, the dimensions of elements, such as the thickness, width, or the like, may be exaggerated or reduced, and thus the thickness, width, or the like of elements of the present invention is not limited to the illustration of the drawings.

Hereinafter, exemplary embodiments of the present disclosure will be described with reference to the drawings.

The display devices according to embodiments set forth herein are a curved display device that is curved from the center to the edges thereof in the inward or outward direction with a predetermined curvature. However, the embodiments are not limited to a curved display device but may be applied to any display device that includes a bottom cover and is curved.

Figure 2:
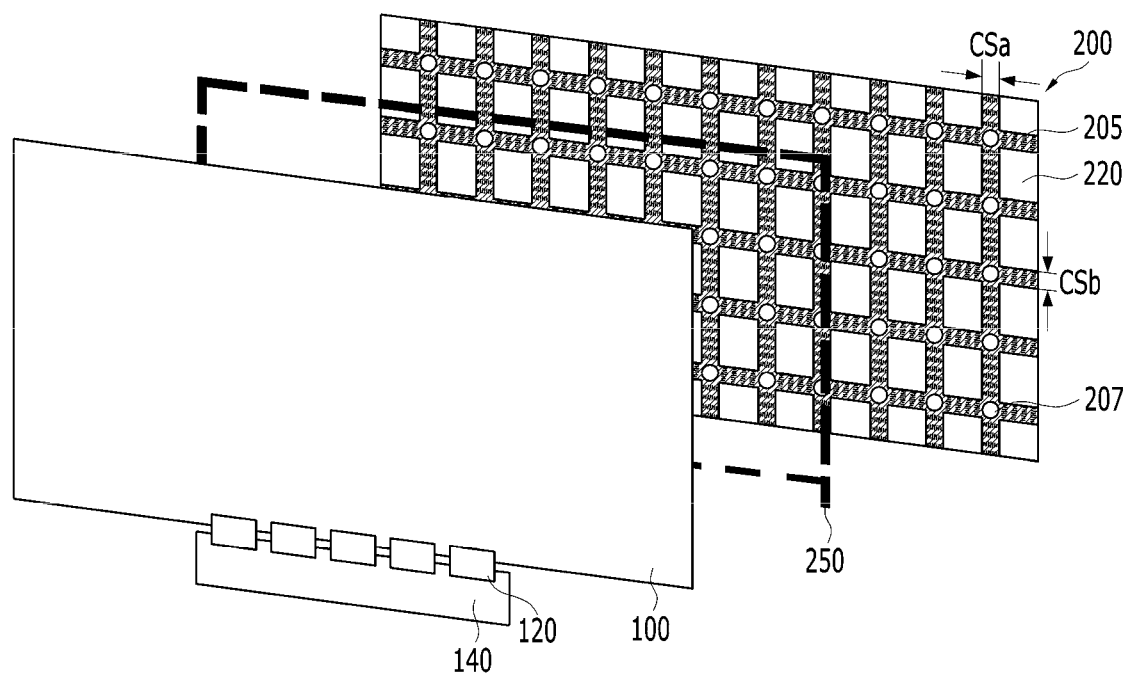
FIG. 2 is a perspective view of a curved display device according to one embodiment.
Figure 3:
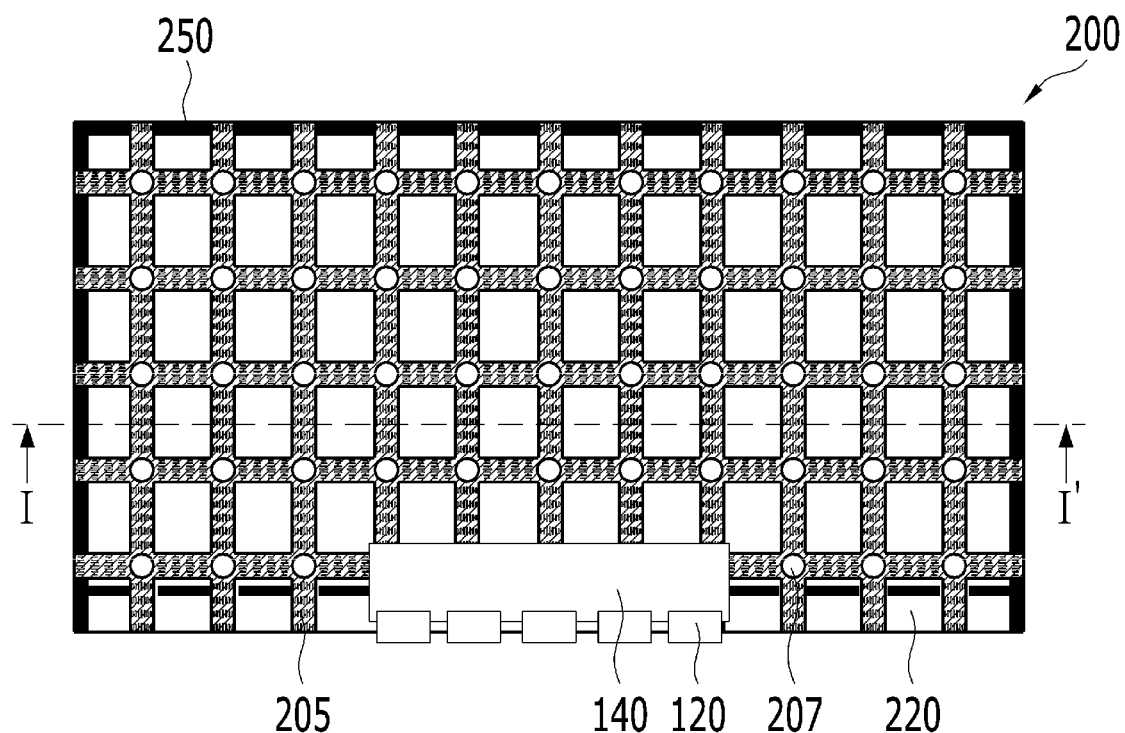
FIG. 3 is a plan view illustrating the constructions of an adhesive layer and a printed circuit board, which are disposed on a bottom cover shown in FIG. 2 according to one embodiment.
Figure 4:
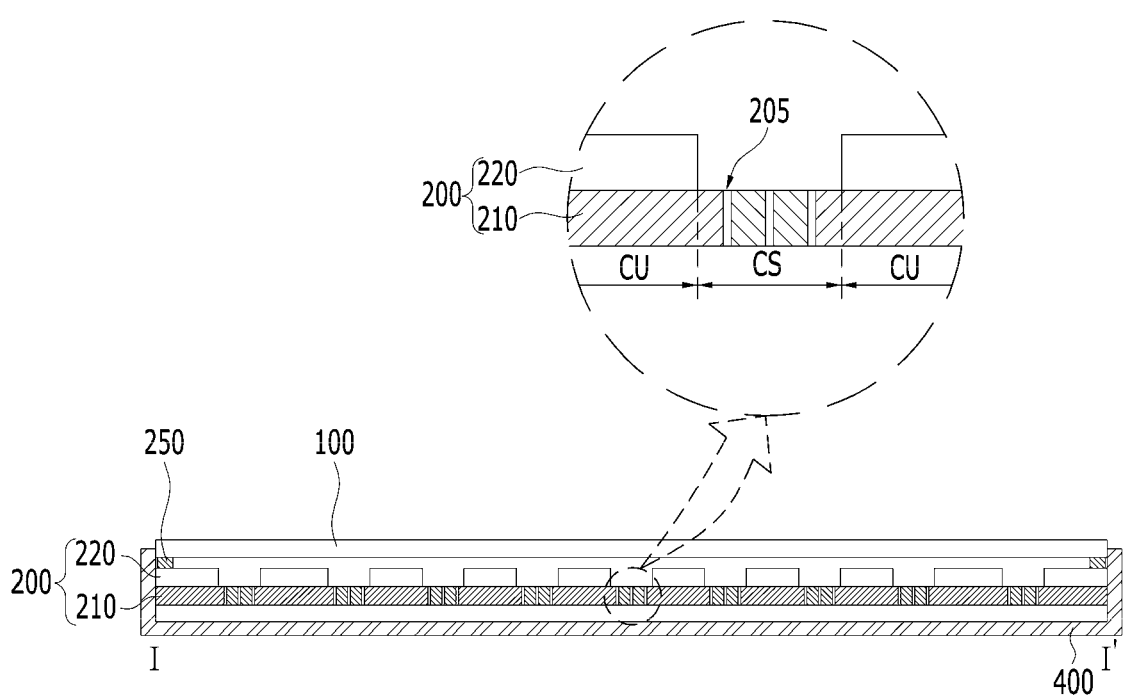
FIG. 4 is a cross-sectional view taken along line I-I' in FIG. 3 according to one embodiment.
Figure 5:
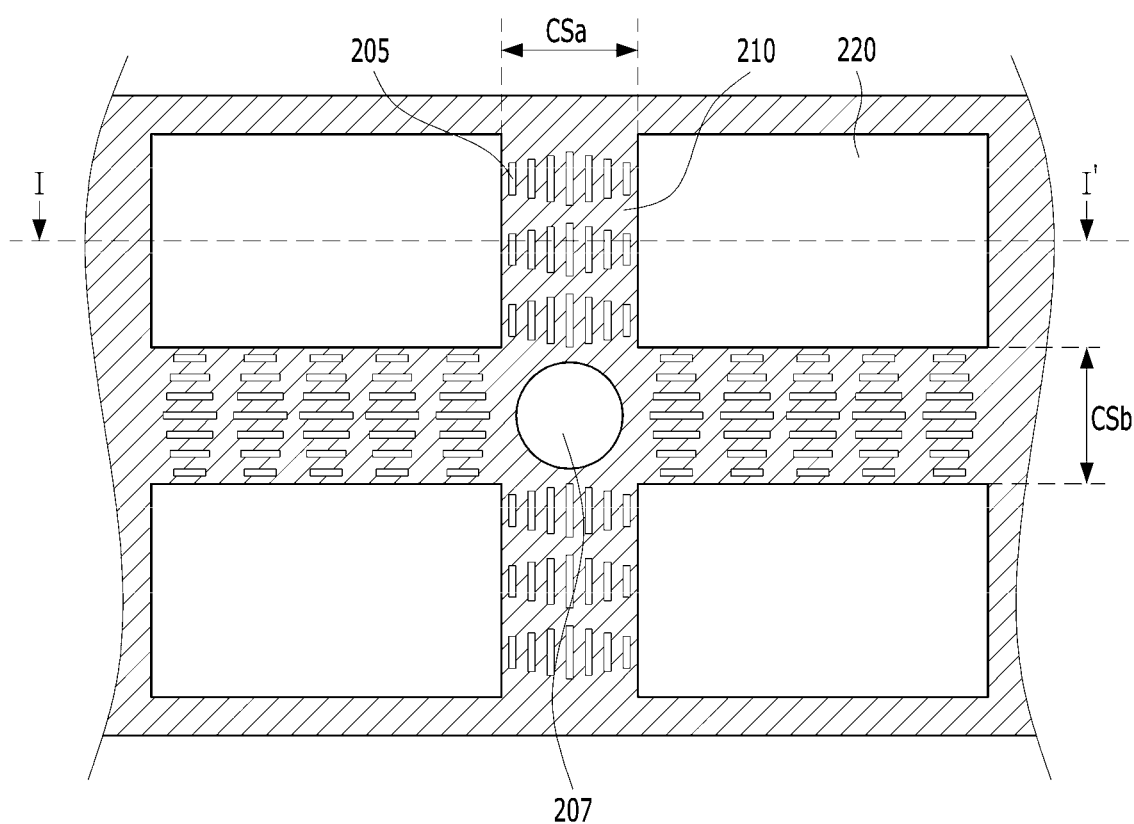
FIG. 5 is a plan view of the bottom cover according to one embodiment.

FIG. 2 is a perspective view of a curved display device according to one embodiment. FIG. 3 is a plan view illustrating the constructions of an adhesive layer and a printed circuit board, which are disposed on a bottom cover shown in FIG. 2 according to one embodiment. FIG. 4 is a cross-sectional view taken along line I-I' in FIG. 3 according to one embodiment. FIG. 5 is a plan view of the bottom cover according to one embodiment.

As shown in FIGS. 2 to 5, the curved display device according to the present disclosure includes a bottom cover 200, which includes a first layer 210 and a second layer 220, and a display panel 100 disposed on the second layer 220 of the bottom cover 200. The first layer 210 of the bottom cover 200 is formed in a plate configuration, and includes a plurality of flat portions CU having the same thickness and arranged in a matrix form and a pattern portion CS (CSa and CSb) including a plurality of slits 205 and 207 formed between the flat portions CU. The second layer 220 of the bottom cover 200 is disposed on the first layer 210 and includes a plurality of heat-dissipating metal members, which are arranged in a group on the same layer so as to come into contact only with the flat portions CU.

The first layer 210 is formed of a material having relatively high stiffness such as, for example, steel use stainless (SUS), in order to maintain the stiffness of the entire bottom cover 200 to a sufficient level and to stably support the display panel 100.

The second layer 220 is formed of a metal material such as, for example, aluminum or graphite, in order to rapidly dissipate heat generated from the display panel 100 or a printed circuit board 140, which faces the second layer 220.

In addition to the assurance of sufficient stiffness and improved heat dissipation performance due to the properties of the materials of the first and second layers 210 and 220, the curved display device of the present disclosure is characterized in that the first layer 210 and the second layer 220 are adhered to each other by clad-bonding and in that the second layer 220 and the pattern portion CS including the slits 205 and 207 are provided in the form of a block through etching selectively performed thereon, whereby the bottom cover 200 is capable of flexibly responding to the inwardly curved deformation or the outwardly curved deformation of the curved display device, and serves to absorb thermal expansion attributable to high heat.

For example, the first layer 210 provides the device with enhanced stiffness as well as flexibility through contraction or expansion of the slits 205 and 207 of the pattern portion CS in response to the curved deformation of the device without any influence on the configuration of other regions. In addition, the first layer 210 is bonded to the heat-dissipating metal members of the second layer 220, thereby realizing a clad metal coupling structure. This clad metal coupling structure absorbs some heat dissipated and transferred thereto, thus preventing thermal expansion to a certain extent.

Further, the first layer 210 is formed of steel use stainless (SUS), which has higher stiffness than the heat-dissipating metal members and the material of the display panel 100, and therefore maintains the stiffness of the entire device to a sufficient level.

Further, the heat-dissipating metal members of the second layer 220 not only exhibit excellent heat dissipation performance due to the properties of the material thereof but also support the deformation of the pattern portion CS due to the patterned arrangement thereof in an island shape.

An adhesive pad 250 is provided along the edges of the display panel 100 and the second layer 220 while being disposed therebetween. The adhesive pad 250 fixes the locations of the display panel 100 and the bottom cover 200. The adhesive pad 250 may be located further outwards than an active area of the display panel 100.

The adhesive pad 250 is formed of a material selected from the group consisting of acrylic resin, epoxy resin, and a combination thereof, whereby the display panel 100 and the bottom cover 200 are bonded and fixed to each other. The adhesive pad 250 also exhibits a shock-absorbing function, and therefore serves to mitigate shocks that occur at the time of curved deformation or assembly of the device.

The display panel 100 is configured to be flexibly curved in response to the curved deformation of the device. To this end, the display panel is formed to have predetermined flexibility and a slim configuration. This display panel 100 may be an organic light-emitting display panel or an electrophoretic display panel, which uses a self-illuminating light-emitting element and therefore does not require a separate light source. For example, in the case in which the display panel 100 is embodied by an organic light-emitting display panel, the display panel 100 may include a substrate, a thin-film transistor array for driving a plurality of sub-pixels, an organic light-emitting element connected with a thin-film transistor in each of the sub-pixels, and an encapsulation portion for protecting at least the organic light-emitting element from external air. The display panel 100 may be configured such that the overall thickness thereof from the substrate to the encapsulation portion is set to 1 mm or less. An air gap may be present in the region between the display panel 100 and the bottom cover 200, except for the region occupied by the adhesive pad 250, which is kept in contact with the edges of the bottom cover 200.

The printed circuit board 140 is connected to one side of the display panel 100 via flexible films 120 in order to drive the display panel 100. The printed circuit board 140 is bent and extends to the region under the bottom surface of the display panel 100, and is therefore located between the display panel 100 and the bottom cover 200. In this case, the adhesive pad 250 may be eliminated from the portion in which the printed circuit board 140 is located. A piece of heat-dissipating tape (not shown) may be bonded to the portion of the printed circuit board 140 that is bent and extends so as to face the bottom cover 200.

The component denoted by reference numeral 400 in FIG. 4 may be referred to as a frame or a system cover, which functions to adjust the curvature of the curved display device. The frame or the system cover 400 may be formed to have a container shape, as illustrated in the drawing, or may be formed to have a bar shape as needed.

The electronic device according to the present disclosure may be configured such that the above-described curved display device is contained in the system cover 400.

The bottom cover 200 is manufactured in the following way.

First, the first layer is formed using steel use stainless (SUS) as a primary ingredient, and the second layer is formed using a heat-dissipating metal material such as, for example, aluminum (Al) or graphite, and is stacked on the first layer. These two stacked metal layers are rapidly bonded to each other through a rolling process under a high-pressure condition, thereby realizing an integral clad metal coupling structure. This clad metal coupling structure may exhibit heat dissipation performance and stiffness superior to the heat dissipation performance and stiffness that would be exhibited by a first layer or second layer alone.

Subsequently, a portion of the second layer 220 is eliminated so as to have a matrix configuration. The remaining portion of the second layer 220 directly faces the display panel 100 or the printed circuit board 200, and serves as a heat-dissipating layer for absorbing heat generated from the display panel 100 or the printed circuit board 200 and rapidly dissipating the heat. To this end, the heat-dissipating metal members are formed of a metal material having relatively high heat conductivity. The heat-dissipating metal members of the second layer 220 are spaced apart from each other and are arranged in a plurality of rows and a plurality of columns in a matrix form. A portion of the first layer 210 formed using steel use stainless, on which the second layer 220 is not stacked, is exposed in the form of a lattice structure, in which horizontal lines having a predetermined width and vertical lines having a predetermined width intersect each other.

The exposed portion of the first layer is partially eliminated throughout the thickness thereof, and thus serves as the pattern portion CS. Specifically, the pattern portion CS includes the slits 205 and 207, which are formed by performing an etching process on the lattice-like exposed portion of the first layer so that the exposed portion of the first layer is selectively eliminated throughout the thickness of the first layer 210. That is, the bottom cover 200 is configured such that the second layer 220 is not present on the slits 205 and 207 and such that the slits 205 and 207 penetrate the first layer.

As described above, the bottom cover 200 has a two-layered structure including the steel use stainless layer and the heat-dissipating metal layer. The upper layer of the bottom cover 200, which faces the display panel 100, is the second layer 220, which is patterned so as to exhibit the heat dissipation function, and the lower layer of the bottom cover 200 is the first layer 210, which has a plate configuration and includes the flat portion CU adhered to the second layer 220 by clad-bonding and the pattern portion CS having the slits 205 and 207 formed in the portion of the first layer 210 on which the second layer 220 is not located. When the device is curved by the frame or the system cover 400, the device can be expanded or contracted by the first layer 210 in response to the direction in which the device is curved. The portion in which the slits 205 and 207 are formed exhibits the function of a spring when stress is applied to the device due to curved deformation, whereby the device can be expanded or contracted in response to curved deformation without any change in the heat-dissipating metal members of the second layer 220, which are provided in the form of a block, or the flat portion CU of the first layer 210.

The reason for forming the first layer 210 using steel use stainless (SUS) is to assure sufficient stiffness and flexibility in spite of the small thickness thereof. Steel use stainless is a material that has a modulus greater than the modulus of a metallic element included in the display panel 100 or the heat-dissipating metal members of the second layer 220 that are kept in contact with the first layer 210. In general, a modulus is a coefficient that expresses stiffness. A smaller modulus indicates higher elasticity, and a larger modulus indicates lower elasticity and higher stiffness, i.e. a property of maintaining an original state. A Young's modulus may be measured, and the measured value may be used.

The heat-dissipating metal members of the second layer 220 have been described above as being formed of aluminum or graphite. However, the heat-dissipating metal members of the second layer 220 may be formed of any other material, as long as it has high heat conductivity and stable etching characteristics. In order to enable the aforementioned two-layered structure to obtain both enhanced stiffness and excellent heat dissipation characteristics, the second layer 220 and the first layer 210 may be formed of metal materials that can realize a clad metal coupling structure therebetween.

In the process of manufacturing the bottom cover 200, the reason for forming the second layer 220 so as to have a matrix form and forming the pattern portion CS in the first layer 210 through etching after the formation of the two-layered clad metal coupling structure is as follows.

It is difficult to stack the heat-dissipating metal members, which are formed in an island shape, directly on steel use stainless (SUS), and thus a piece of double-sided adhesive tape needs to be used to attach the heat-dissipating metal members to SUS. However, in this case, a process of attaching the heat-dissipating metals is additionally required. Further, in terms of the structure, the adhesive layer, i.e. a piece of adhesive tape, is interposed between the heat-dissipating metal members and SUS, that is, is located in the heat dissipation path, whereby heat is dissipated by passing through the adhesive tape, leading to degradation of heat dissipation performance. Furthermore, because the adhesive layer is adhered to the bottom surface of the active area of the display panel 10, the adhesive layer may be deformed by repeated curved deformations, and the deformation of the adhesive layer may be seen through the display panel 100. In order to prevent this problem, the bottom cover 200 of the present disclosure is manufactured in a manner such that the two- or more-layered clad metal coupling structure is formed, the second layer 220 is subsequently formed so as to include the heat-dissipating metal members that are spaced apart from each other in a matrix form through etching, and the plate-shaped first layer 210 is subsequently formed so as to include the pattern portion CS formed in the region between the heat-dissipating metal members through etching. In this case, no adhesive layer is needed between the first layer 210 and the second layer 220.

As shown in the plan views, the width of the pattern portion CS, which is formed in a lattice structure, may vary from the center to the edges of the first layer 210, or may be constant. The number of slits formed in the pattern portion CS may vary depending on the target curvature with which the curved display device is designed to be curved. The larger the number of slits formed in the pattern portion CS, the more stable the expansion or contraction of the curved display device in spite of curved deformation at a relatively large curvature.

Hereinafter, the inwardly curved deformation of the curved display device of the present disclosure (the deformation in which the display panel 100 is curved in the inward direction) and the outwardly curved deformation of the curved display device of the present disclosure (the deformation in which the display panel 100 is curved in the outward direction) will be described.

Figure 6A:
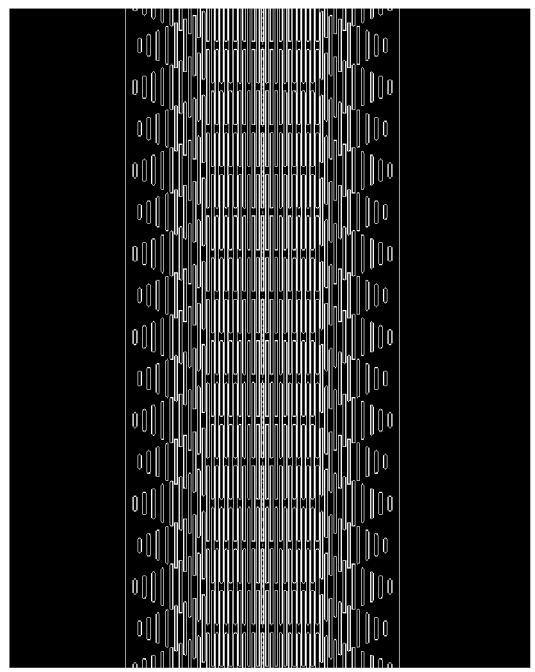
FIGS. 6A to 6C are pictures respectively showing the normal state, the contracted state and the expanded state of a pattern portion of a first layer of the bottom cover in the curved display device of the present disclosure.
Figure 6B:
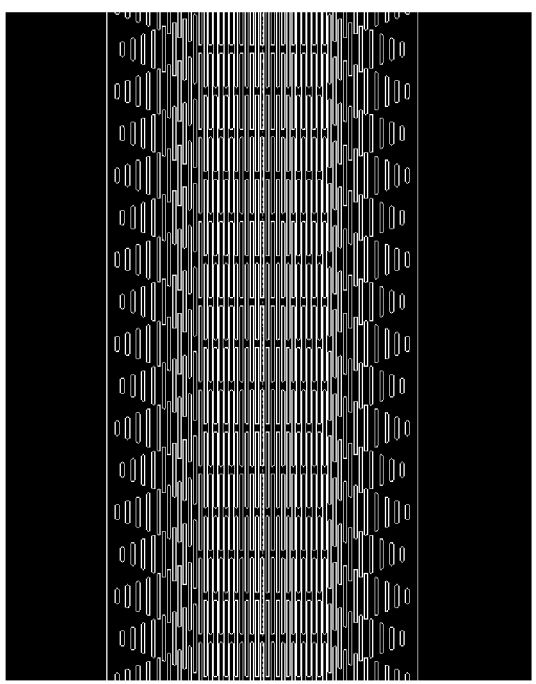
Figure 6C:
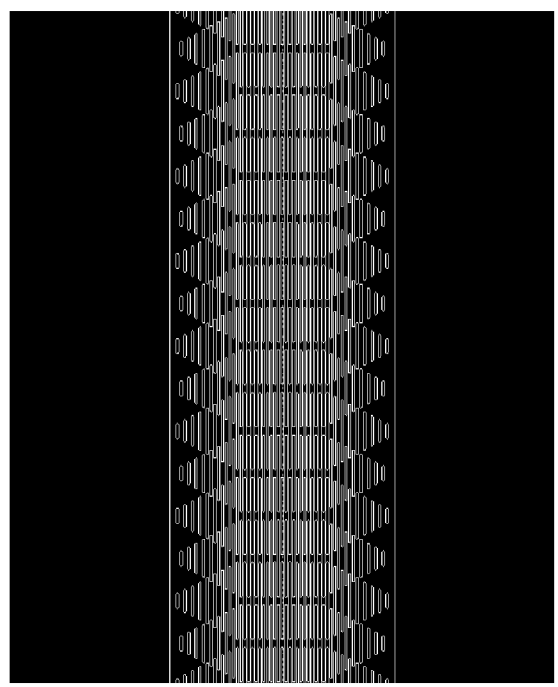

FIGS. 6A to 6C are pictures respectively showing the normal state, the expanded state and the contracted state of the pattern portion of the first layer of the bottom cover in the curved display device according to the present invention.

As shown in FIG. 6A, in the state in which no stress is applied to the display panel and the display panel is therefore maintained in a flat state, the pattern portion of the first layer of the bottom cover is maintained in a normal state. As shown in FIG. 6B, in the state in which the display panel is deformed so as to be curved in the inward direction (refer to "Inner Curve" in FIG. 7B), the pattern portion CS of the bottom cover 200, which is disposed under the bottom surface of the display panel 100, is expanded. On the other hand, as shown in FIG. 6C, in the state in which the display panel is deformed so as to be curved in the outward direction (refer to "Outer Curve" in FIG. 7A), the pattern portion CS of the bottom cover 200, which is disposed under the bottom surface of the display panel 100, is contracted.

Figure 7A:
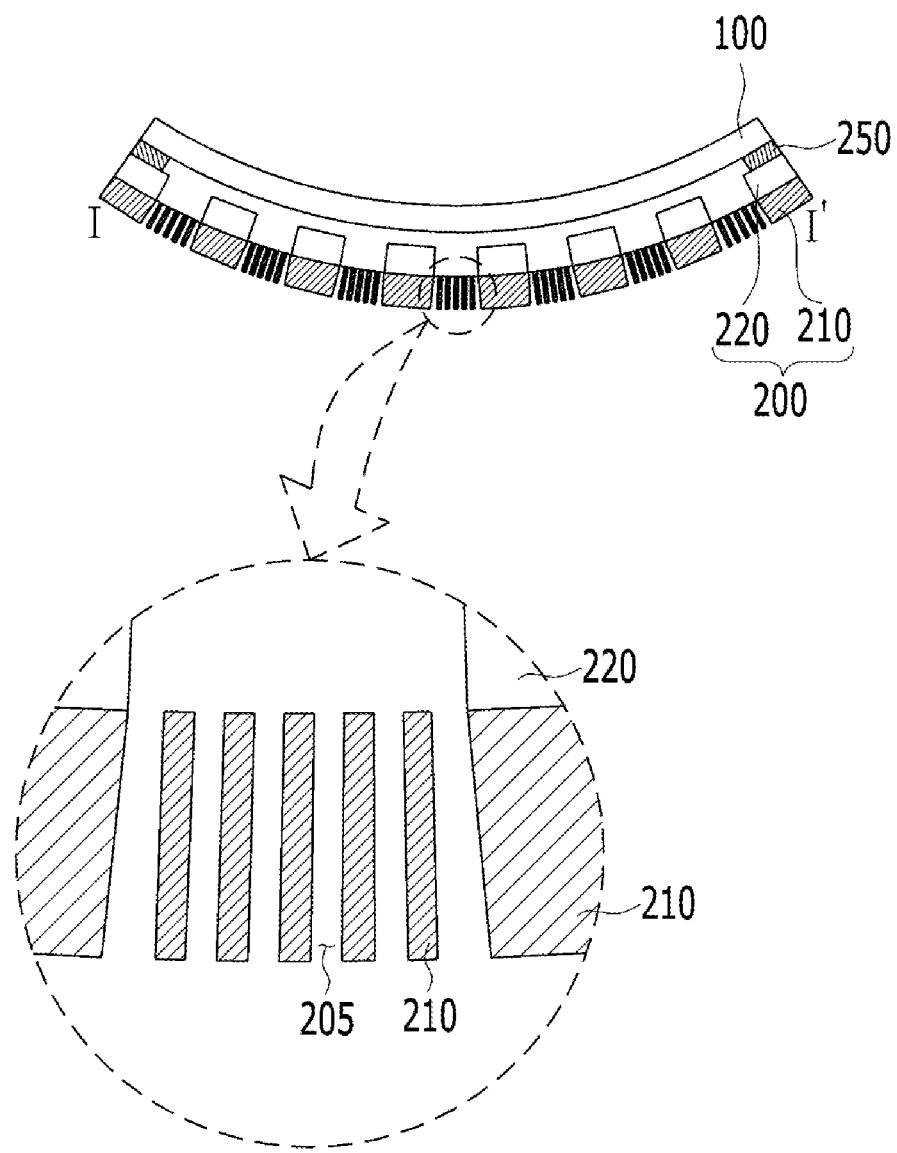
FIGS. 7A and 7B are cross-sectional views respectively showing inwardly curved deformation and outwardly curved deformation of the curved display device according to one embodiment.
Figure 7B:
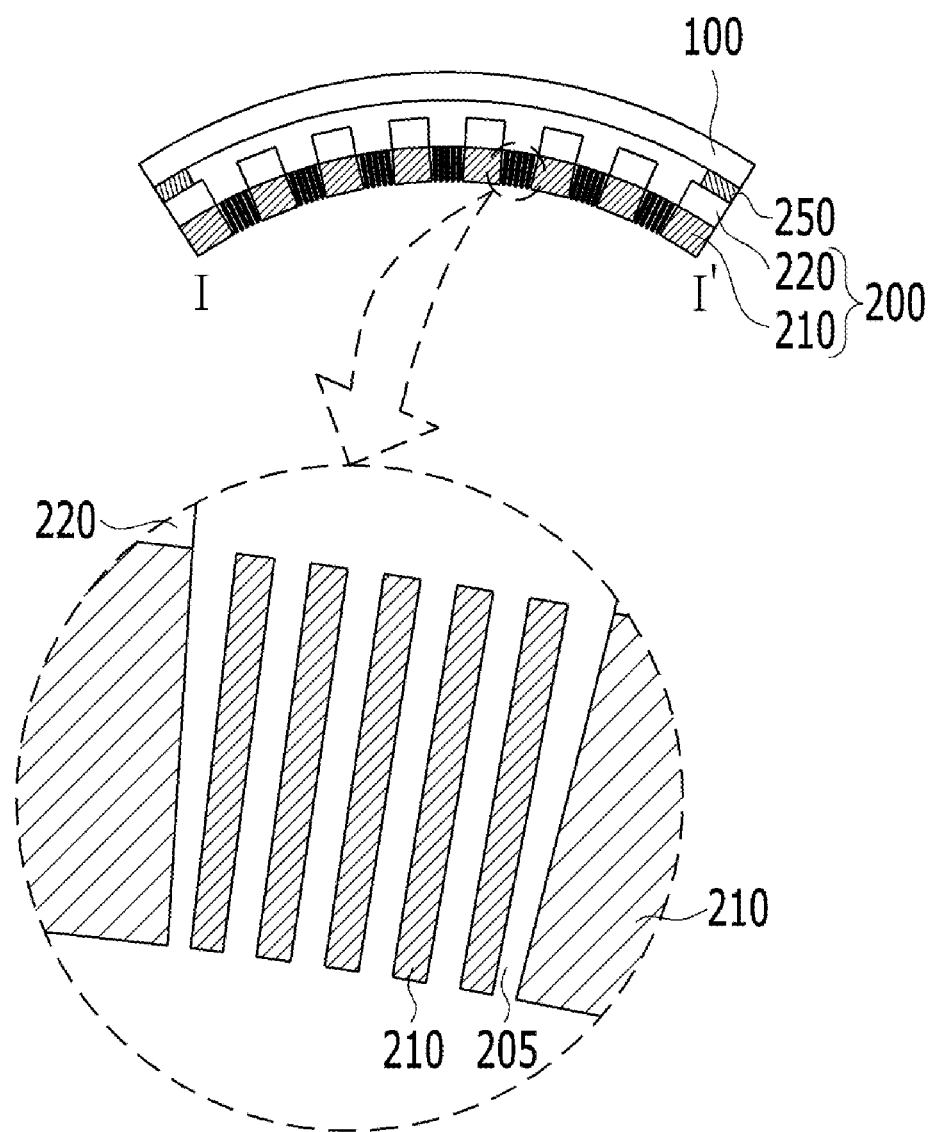

FIGS. 7A and 7B are cross-sectional views respectively showing the inwardly curved deformation ("Inner Curve") and the outwardly curved deformation ("Outer Curve") of the curved display device according to one embodiment.

As shown in FIG. 7A, when the curved display device is deformed so as to be curved in the inward direction, the pattern portion CS (refer to FIGS. 1 to 4) is also curved in the first layer 210 of the bottom cover 200 such that the upper portion thereof and the lower portion thereof have different curvatures from each other. That is, the pattern portion CS is curved such that the curvature of the lower portion thereof is greater than the curvature of the upper portion thereof. Therefore, the pattern portion CS is expanded in a manner such that the lower portion of each of the slits 207 is widened further than the upper portion of each of the slits 207 in response to the inwardly curved deformation. As a result, curved deformation of the curved display device can be realized stably without any influence on the configuration of other regions or the occurrence of slip between the layers.

As shown in FIG. 7B, when the curved display device is deformed so as to be curved in the outward direction, the pattern portion CS (refer to FIGS. 1 to 4) is also curved in the first layer 210 of the bottom cover 200 such that the upper portion thereof and the lower portion thereof have different curvatures from each other. That is, the pattern portion CS is curved such that the curvature of the lower portion thereof is less than the curvature of the upper portion thereof. Therefore, the pattern portion CS is contracted in a manner such that the lower portion of each of the slits 207 is narrowed further than the upper portion of each of the slits 207 in response to the outwardly curved deformation. As a result, curved deformation of the curved display device can be realized stably without any influence on the configuration of other regions or the occurrence of slip between the layers.)

As is apparent from the above description, the curved display device and the electronic device using the same according to the present disclosure have the following effects.

In the curved display device that includes a display panel and a bottom cover, which are disposed adjacent to each other due to a slim construction, the bottom cover is formed to have a two- or more-layered clad metal coupling structure, and a heat dissipation layer and a pattern portion are defined in the bottom cover through etching, whereby it is possible to assure improved heat dissipation performance and stiffness.

That is, the heat dissipation layer, which faces the display panel, is patterned so as to have a matrix form, a stiff metal layer, which is formed of steel use stainless (SUS), is bonded to the heat dissipation layer by clad-bonding, and a pattern portion, in which slits are formed, is provided in the region in which the heat dissipation layer is not formed. The slits exhibit the function of a spring upon inwardly curved deformation or outwardly curved deformation of the curved display device. As a result, the curved deformation of the curved display device can be realized stably without any influence on the configuration of other regions or the occurrence of slip between the layers.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A curved display device comprising:
   a bottom cover comprising a first layer and a second layer; and
   a display panel over the second layer of the bottom cover,
   wherein the first layer is formed in a plate configuration, and comprises a plurality of flat portions having a same thickness and arranged in a matrix form and a pattern portion comprising a plurality of slits formed between the flat portions, and
   the second layer of a material different from the first layer is disposed on the first layer, and comprises a plurality of heat-dissipating metal members spaced apart from each other on a same layer, each of the heat-dissipating metal members in contact with the flat portions.

2. The curved display device according to claim 1, further comprising:
   an adhesive pad provided along edges of the display panel and the second layer while being disposed therebetween, wherein an air gap is disposed between the display panel and the second layer except for a region occupied by the adhesive pad.

3. The curved display device according to claim 2, further comprising at least one space among the heat dissipating metal members in the second layer, wherein the at least one space has a vertical distance between a rear surface of the display panel and the first layer, and the vertical distance is greater than a thickness of the air gap.

4. The curved display device according to claim 1, further comprising:
   a printed circuit board connected to one side of the display panel, the printed circuit board being disposed between the display panel and the bottom cover.

5. The curved display device according to claim 4, wherein the printed circuit board is connected to the one side of the display panel via a flexible film.

6. The curved display device according to claim 1, wherein the first layer is formed of steel use stainless that has higher stiffness than materials of the heat-dissipating metal members and the display panel.

7. The curved display device according to claim 1, wherein the heat-dissipating metal members are bonded to the flat portions by clad-bonding.

8. The curved display device according to claim 1, wherein the display panel is configured to be inwardly curved or outwardly curved.

9. The curved display device according to claim 1, wherein the bottom cover is capable of flexibly responding to an inwardly curved deformation or an outwardly curved deformation of the display panel.

10. The curved display device according to claim 1, wherein the pattern portion is provided by surrounding the flat portions at a plurality of horizontal lines and a plurality of vertical lines in the first layer.

11. The curved display device according to claim 10,
    wherein the plurality of slits in the pattern portion comprise first slits and second slits,
    wherein the first slits are located at intersections of horizontal lines and vertical lines, and the second slits are located at the horizontal lines and vertical lines except for the intersections, and
    wherein each of the first slits are bigger than each of the second slits.

12. The curved display device according to claim 11, wherein widths of the second slits vary from a center to an edge at each of the horizontal lines and lengths of second slits vary from a center to an edge at each of the vertical lines.

13. The curved display device according to claim 1, wherein each of the plurality of slits penetrates the first layer.

14. The curved display device according to claim 13, wherein intervals of the plurality of slits are larger at a bottom than at a top during an inwardly curved deformation of the display panel.

15. The curved display device according to claim 13, wherein intervals of the plurality of slits penetrates are larger at a top than at a bottom during an outwardly curved deformation of the display panel.

16. The curved display device according to claim 1, wherein the display panel is an organic light-emitting display panel or an electrophoretic display panel.

17. The curved display device according to claim 1, wherein the display panel is configured such that an overall thickness is set to 1 mm or less.

18. The curved display device according to claim 1, wherein the display panel includes a substrate, a thin-film array for driving a plurality of sub-pixels, an organic light-emitting element connected with a thin-film transistor in each of the sub-pixels, and an encapsulation portion for protecting at least the organic light-emitting element from external air.

19. The curved display device according to claim 1, further comprising a system cover to accommodate the display panel and the bottom cover, wherein an upper surface and a part of lateral surface of the display panel is exposed from the system cover.

20. An electronic device comprising:
    a curved display device comprising:
        a bottom cover comprising a first layer and a second layer; and
        a display panel over the second layer of the bottom cover; and a system cover for containing the display panel and the bottom cover such that a top surface of the display panel is exposed, wherein the first layer is formed in a plate configuration, and comprises a plurality of flat portions having a same thickness and arranged in a matrix form and a pattern portion comprising a plurality of slits formed between the flat portions, and the second layer of a material different from the first layer is disposed on the first layer, and comprises a plurality of heat-dissipating metal members spaced apart from each other on a same layer, each of the heat-dissipating metal members in contact with the flat portions.

21. The electronic device according to claim 20, further comprising:

an adhesive pad provided along edges of the display panel and the second layer while being disposed therebetween, wherein an air gap is disposed between the display panel and the second layer except for a region occupied by the adhesive pad.

22. The electronic device according to claim 20, further comprising:

a printed circuit board connected to one side of the display panel, the printed circuit board being disposed between the display panel and the bottom cover.

23. The electronic device according to claim 22, wherein the printed circuit board is connected to the one side of the display panel via a flexible film.

24. The electronic device according to claim 20, wherein the first layer is formed of steel use stainless that has higher stiffness than materials of the heat-dissipating metal members and the display panel.

25. The electronic device according to claim 20, wherein the heat-dissipating metal members are bonded to the flat portions by clad-bonding.

* * * * *